SELECTION AND INTERCONNECTION OF DEVICES ON A MULTIDEVICE WAFER

Filed Dec. 12, 1968 3 Sheets-Sheet 1

RICHARD J. BONCUK
INVENTOR.

BY Spensley & Horn
ATTORNEY

RICHARD J. BONCUK
INVENTOR.

BY Spensley & Horn
ATTORNEY

June 22, 1971 R. J. BONCUK 3,585,712

SELECTION AND INTERCONNECTION OF DEVICES ON A MULTIDEVICE WAFER

Filed Dec. 12, 1968 3 Sheets-Sheet 3

RICHARD J. BONCUK
INVENTOR.

BY Spensley & Horn
ATTORNEYS

United States Patent Office 3,585,712
Patented June 22, 1971

3,585,712

SELECTION AND INTERCONNECTION OF DEVICES ON A MULTIDEVICE WAFER

Richard J. Boncuk, Wilmington, Calif., assignor to TRW Semiconductors, Inc., Lawndale, Calif.

Filed Dec. 12, 1968, Ser. No. 783,355
Int. Cl. B01j *17/00;* H01l *7/00*
U.S. Cl. 29—574 17 Claims

ABSTRACT OF THE DISCLOSURE

A method of testing and selecting semiconductor devices on a multidevice wafer whereby the devices having characteristics within specified limits are interconnected to form an integrated circuit or array. A mask indicating the position of defective devices or cells is utilized with conventional photolithographic techniques to provide a pattern for connections between only those devices meeting the specified requirements.

BACKGROUND OF THE INVENTION

(I) Field of the invention

The invention relates generally to the fabrication of integrated circuits and arrays where isolated semiconductor devices are interconnected to yield desired circuits.

(II) Description of the prior art

The existing method for interconnecting several devices consists of first connecting several transistors, or other semiconductor devices, together and then testing and removing the interconnection to the devices which are not within specifications. Because there is no provision for first testing the isolated devices, quite often devices which are within specification must be disconnected from defective devices, resulting in additional expense.

Some recent attempts have been made to test devices in isolation and to have the position and specifications of each device memorized on a computer. The computer then outlines a final metalization pattern which provides the interconnection between devices having only the desired specifications. Thus far, it is believed that this latter method has not been operational and further, it is a far more expensive method for accomplishing the same basic results as are obtained by this invention.

SUMMARY OF THE INVENTION

One of the purposes of the present invention is to increase the yield of single chip devices by first making isolated semiconductor devices, such as transistors, testing the devices and connecting only those devices which are within the desired specifications. The invention utilizes a masking technique whereby the location of defective devices is indicated on a suitable mask. The mask is made in such a manner that each device on the chip or wafer corresponds to a particular location on the mask. By using a testing device which can scan and test the individual devices on the wafer and provide a signal whenever a defective cell is located and a mask marking device receptive to the signal from the testing device, a mask is formed indicating the defective devices. The mask having the exact positions of the defective devices is then placed over the wafer. During the further processing of the wafer the mask causes the defective devices not to be connected to other devices during final metallization.

The mask described may be plastic, i.e., Mylar, or a photoresist mask. The technique of the invention can be used whenever a mask can be formed in such a way that a mask marking means is receptive to a signal from a testing device and whereby the testing device and the mask marking means are coupled to each other to provide a substantially simultaneous indication on the mask of the corresponding position of the defective cell on the wafer. Each position on the mask must represent a corresponding device position on the wafer.

After the wafer has been tested and a suitable mask formed, the mask is placed over the wafer in such a manner that the marked portions of the mask coincide with the defective devices on the wafer.

The isolated devices that are tested have been processed completely through a first metalization step prior to the testing step. After testing, a passivating layer (i.e., an oxide layer) is positioned over the isolated devices. Then by means of conventional photolithographic techniques a photoresist layer is applied and developed forming a metal contact pattern which would normally be used for etching contact holes or apertures in the oxide layer for subsequent metal contact with the metal already present from the first metalization step. In the present invention, after the photoresist pattern is developed, the mask produced during the testing of the wafer is aligned in such a manner that the markings on the mask representing the location of defective devices coincide with the corresponding defective device on the wafer. A suitable procedure is then utilized to prevent subsequent processing of the wafer in the areas indicated by the mask to correspond to defective devices. The passivating layer is then etched, however, those contact holes developed in the photoresist layer that the mask indicates as being positions of defective cells are not etched. Therefore, for example, the emitter and base of transistor devices would remain without final contact holes. The wafer is then processed in a conventional manner and the final metalization is applied with the result that no metal is present to provide interconnection with defective cells since those cells have no contact hole patterns etched through the passivating layer or oxide.

DESCRIPTION OF THE PREFERRED EMBODIMENT

Figure 1:
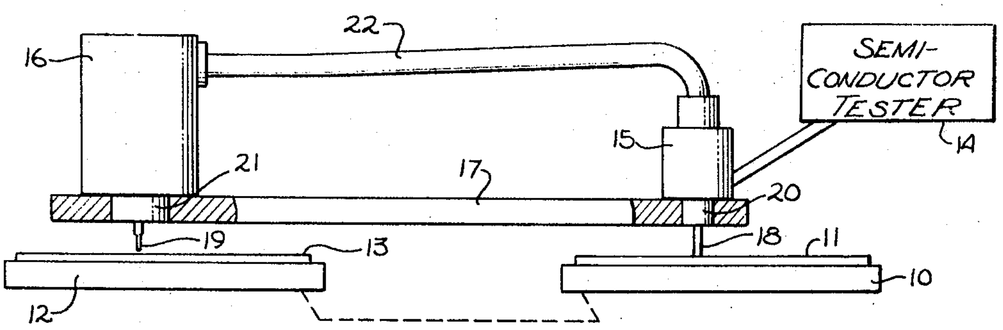
FIG. 1 is a diagrammatic view of a testing device coupled to a mask marking device.

With reference to FIG. 1, a simplified diagrammatic view illustrates the basic testing and mask marking configuration contemplated by the invention. With reference to FIG. 1, there is shown a movable device testing platform 10 coupled to a movable mask platform 12. The platforms 10 and 12 are suitably connected in such a manner that movement in the device testing platform 10 causes a corresponding movement in the mask platform 12.

The device testing platform has multidevice wafer 11 positioned thereon. The mask platform 12 has a suitable mask material 13 (i.e., Mylar) placed thereon. A mounting surface 17 having apertures 20 and 21 is mounted above the platforms 10 and 12. A testing head 15 is mounted on the mounting member 17 in such a manner that testing probes 18 extend through the aperture 20 and make contact with the devices on the wafer 11. The testing head 15 is electrically coupled to a semiconductor tester 14 which is set to test the various predetermined parameters desired for each of the cells. A suitable tester might be one such as the Micro Tech Model 2820 manufactured by Micro Tech Company, Sunnyvale, Calif. The tester 14 when coupled with the testing head 15 will provide a signal whenever the probes 18 locate a defective cell on the wafer 11. A defective cell is one which is not within the specified limits set by the tester 14. The signal from the head 15 is sent through a cable 22 to an actuating means 16 (i.e., solenoid, etc.) mounted on the mounting surface 17 in such a manner that the mask marker 19 extends through the aperture 21 and when actuated contacts the mask 13 in response to a signal from the testing devices to indicate on the mask the positions of defective cells on the wafer 11. The platforms 11 and 13 move in unison and are programmed in a predetermined manner so that the probes 18 will sequentially test each and every device on the wafer 11. Although FIG. 1 illustrates movable platforms 10 and 12 with stationary probes 18 and a stationary mask marker 19 it would be understood that the same system would be operable with a system having stationary platforms and movable testing probes and mask marker.

Figure 2:
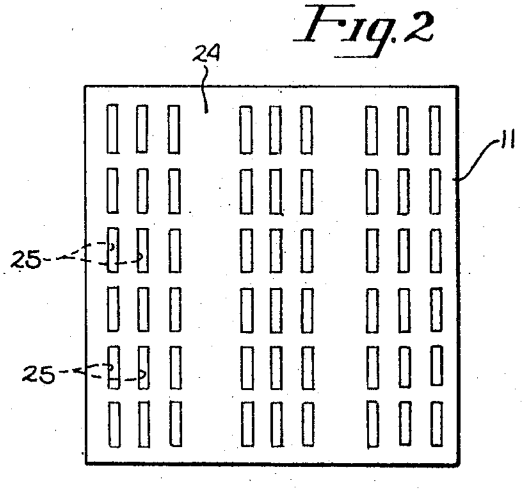
FIG. 2 is a plan view of a multidevice wafer.

FIG. 2 illustrates a multidevice wafer 11 having a substrate 24 and individual isolated transistors 25 which have been processed by standard methods through the first metalization step.

Figure 3:
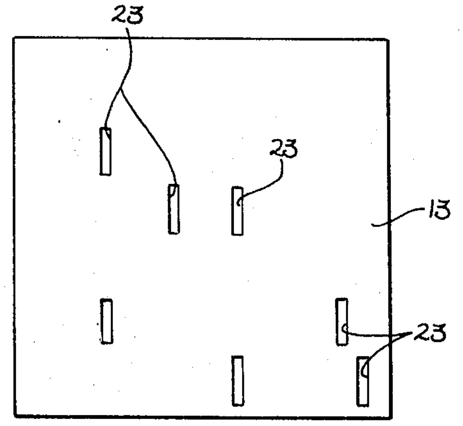
FIG. 3 is a plan view of a mask having apertures thereon corresponding to isolated defective devices on the wafer described in FIG. 2.

FIG. 3 illustrates a mask 13 with apertures 23 punched therein. Although other means of mask marking may be used, the embodiment shown in FIG. 3 utilizes a mask in which the mask marking means 19 is a punch having a configuration slightly larger than the peripheral configuration of the individual isolated transistors 25. The reason for the slightly larger size of the apertures 23 as compared with the devices 25 will be explained in detail hereinafter.

Figure 4:
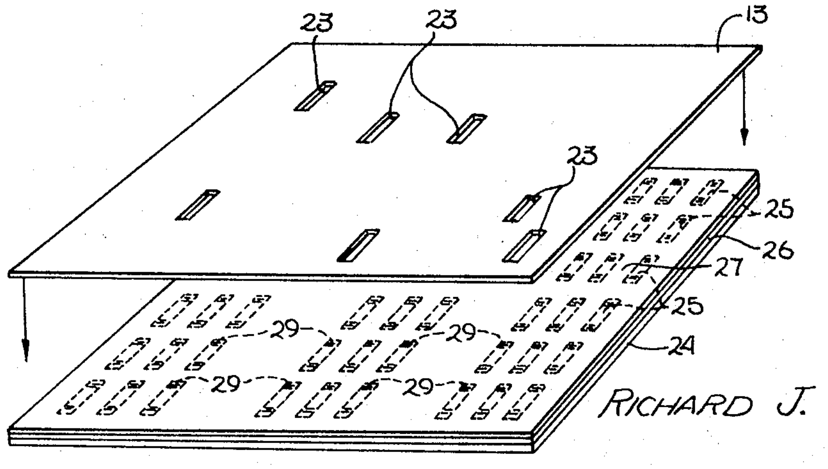
FIG. 4 is a perspective view which illustrates the wafer of FIG. 2 on which a passivating layer and a photoresist layer have been deposited and the mask of FIG. 3 is superimposed and aligned over the wafer.

After the wafer 11 has been tested completely and a mask 13 produced which indicates the position of defective devices, the wafer 11 is removed from the testing apparatus and the device bearing surface coated with a suitable passivating layer 26 (i.e., silicon dioxide) over its entire surface. A photoresist layer 27 is then deposited over the passivating layer 26 and a contact pattern 29 is defined on layer 27 by standard photolithographic techniques. The mask 13 containing apertures 23 is then superimposed over the oxide layer 26 in such a manner that the apertures 23 are aligned and substantially coincident with the defective devices on the wafer 11. (See FIG. 4.)

A wax or other suitable material which will resist the chemical etching to be performed subsequently is applied over the mask 13 so that the wax or other material enters the apertures 23 on the mask 13 and covers those portions of the coated wafer which are coincident with said apertures. Since the apertures 23 are slightly larger than the individual isolated transistirs 25, the entire area of the underlying defective devices are completely covered and alignment difficulties are minimized.

After the wax has been applied and the apertures 23 filled, the mask 13 is removed leaving portions 28 over those areas of the coated wafer having defective cells thereon. (See FIG. 5.)

Figure 5:
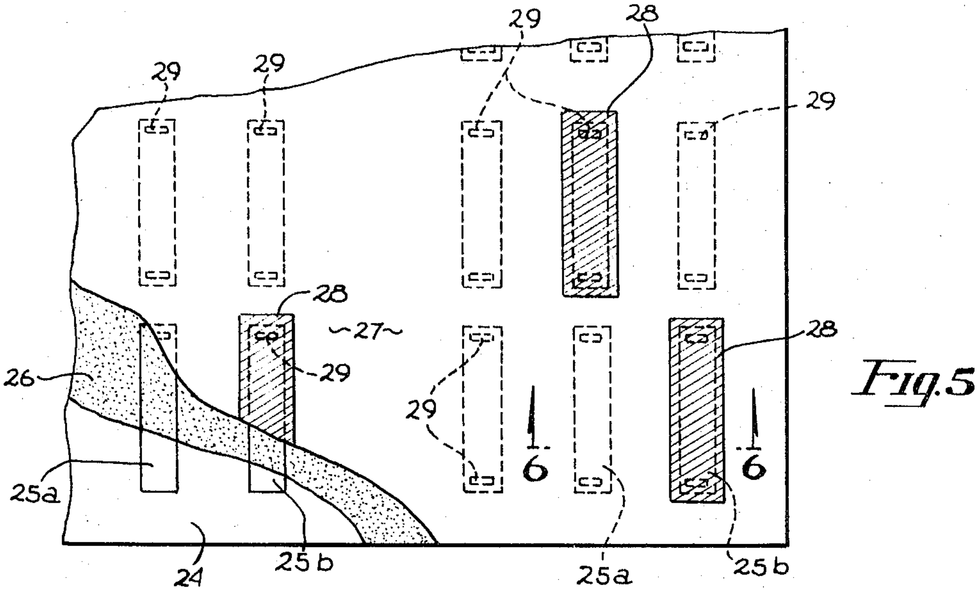
FIG. 5 is a fragmentary plan view of the wafer of FIG. 2 showing the wafer with a passivating layer covered with a photoresist layer and an etch resistant substance which has been applied over the mask and covers the defective devices.
Figure 6:
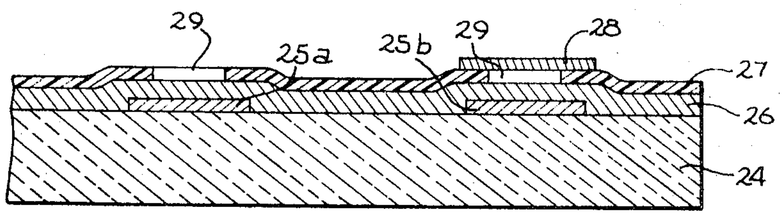
FIG. 6 is a fragmentary cross-sectional view taken along the 6—6 of FIG. 5 and illustrates the different processing configurations between a device within specifications and a defective device.

FIG. 6 is a cross sectional view through cells **25*a* and 25*b* of FIG. 5. 25*a* is a typical cell within specifications and 25*b* is a typical cell which does not meet specifications. Cell 25*a* is shown as having an oxide layer 26, a photoresist layer 27 and a contact pattern 29 exposed on the photoresist by normal photolithographic techniques. The defective cell 25*b* has basically the same configuration except that the photoresist layer 27 and contact pattern 29 in the area of the defective cell are completely covered by the wax covering 28**.

Figure 7:
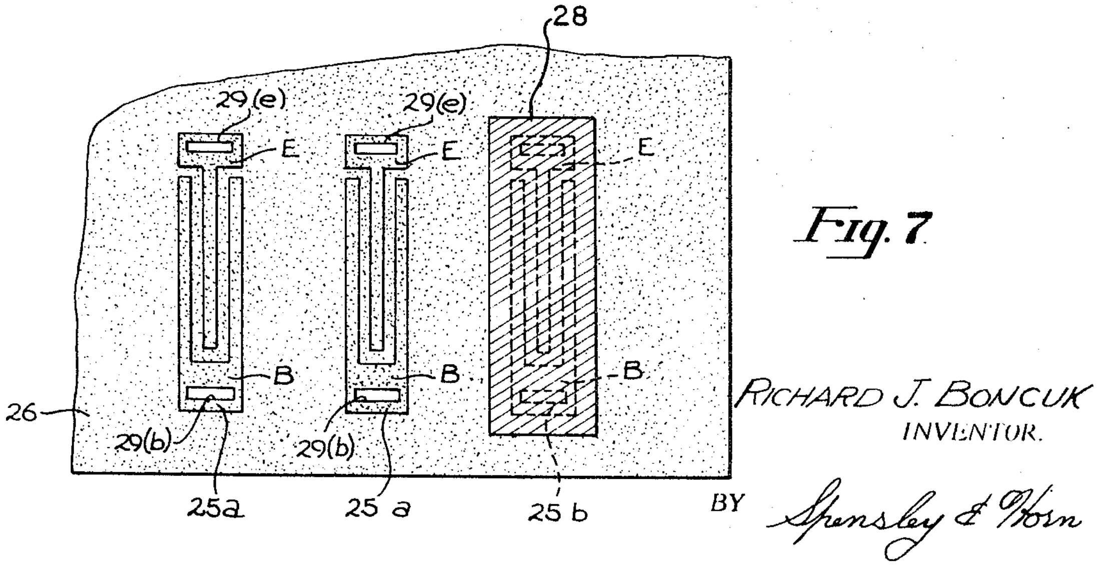
FIG. 7 is a fragmentary plan view illustrating a wafer after the passivating layer has been etched so that contact areas are defined on the devices that are within specifications.

With reference to FIG. 7, a portion of the wafer is shown after the contact pattern defined by the photoresist layer 27 is etched through the oxide layer 26 and the photoresist layer has been selectively removed. The wax covering 28 has prevented the defective cell **25*b* from further processing. The contact pattern provided in the oxide layer 26 may be accomplished by using conventional chemical etchants (i.e. acid solutions) which remove portions of the oxide layer 26 only in the areas coincident with the photolithographic images 29. Wherever the wax 28 is present the oxide layer 26 remains impervious to attack by the chemical etchant. On this stage contact openings 29*e* (for contact with the emitters E) and 29*b* (for contact with the bases B), having the configuration of the images 29 are present only in those areas not covered by the wax 28. The openings 29*e* and 29*b*** will ultimately allow interconnection between the devices within the predetermined specifications. The details of the photolithographic processing and chemical etching are not defined in detail since they are well known in the semiconductor art.

Figure 8:
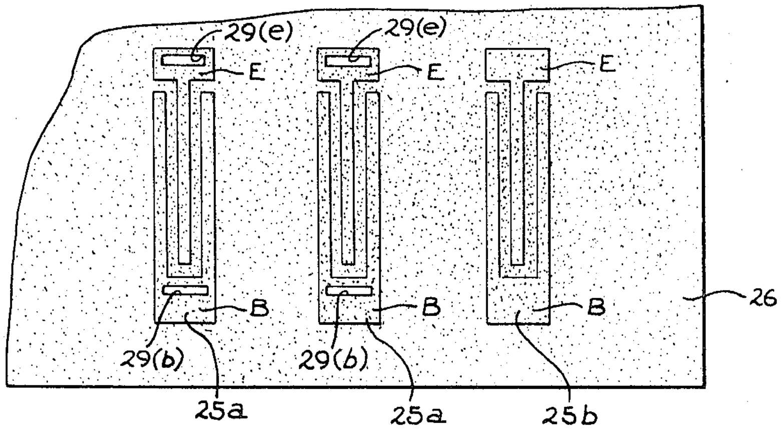
FIG. 8 is a view similar to that of FIG. 7 showing the etch resistant substance removed from the defective devices.

FIG. 8 illustrates a portion of the wafer after the wax portions 28 have been removed from the defective cells and shows that the defective cells, i.e., **25*b***, have no contact openings over the emitter and base portions, E and B respectively, of the isolated transistor device.

Figure 9:
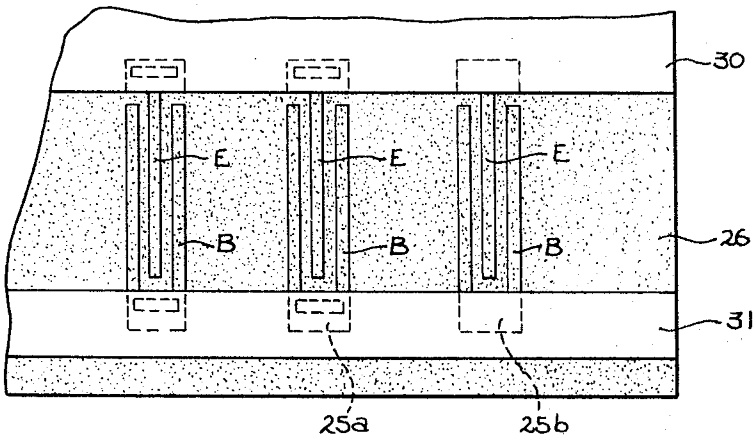
FIG. 9 is a fragmentary plan view illustrating a metalized pattern applied over the wafer so that contact is made between the metalized pattern and the metal of the devices within specifications.
Figure 10:
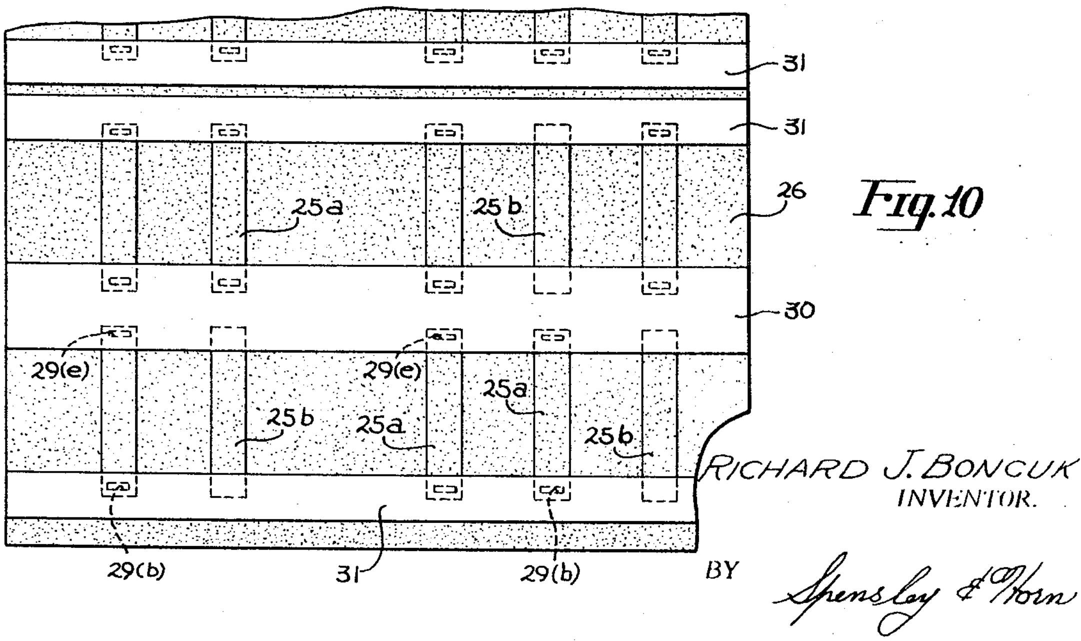
FIG. 10 is a fragmentary plan view showing the overall configuration of a portion of the multidevice wafer in which the devices within the specifications are interconnected while the defective devices remain isolated from the final metalization pattern.

FIGS. 9 and 10 illustrate the configuration after a final metalization step has been completed. Note that only the devices within specifications and have the contact patterns **29*e* and 29*b* etched through the oxide layer are interconnected by the metal strips 31 and 32**; and that the defective cells having no contact pattern etched through their oxide layer are not interconnected with any other cells and therefore remain electrically isolated.

With the above described method, it is obvious that by testing the devices prior to interconnection and by utilizing steps such as those described hereinabove, that when the final metalization step is applied, only the devices within specifications will be interconnected for use in integrated circuits or in the formation of arrays. The above technique has been found to be extremely useful in applications involving connection of high power devices on a single chip and can also be used to achieve large scale integration (LSI) or any other high density monolithic or hybrid constructions in or on a single chip. The time saved by not having to remove the interconnection to defective cells or reconnecting cells within specifications makes for an extremely economical technique.

While the method described above of achieving cell selection uses a mask such as one made of Mylar, it should be understood that the Mylar mask could be replaced with other suitable solid surface materials or with a photoresist mask. A photoresist mask can be modified to show the position of defective cells, then by reverse photoresist techniques an ink mark, or the like, could be used to darken or cover the light areas in the mask which correspond to defective cells in the areas where the oxide layer beneath the mask would normally be etched. The remaining portion of the method would then remain the same as that described above. The major difference between the two methods is that photolithographic means (i.e., a photoresist mask and darkening agent) would be used instead of a substance like a wax for covering the areas in which no metal contact pattern was desired.

It is to be understood that the above described arrangements and techniques are illustrative of the application of the principles of the invention. Numerous other arrangements may be devised by those skilled in the art without departing from the spirit and scope of the invention.

We claim:

1. A method for testing and interconnecting semiconductor devices on a multidevice wafer comprising the steps of:

(a) testing the semiconductor devices in a predetermined sequence to determine which devices are defective and which are within predetermined specifications;

(b) forming a mask with indications thereon corresponding to the precise positions of the defective devices on said wafer, each of said indications having an area slightly larger than one of said devices;

(c) coating the device bearing surface of the wafer with a passivating layer;

(d) providing a photoresist layer adjacent to said passivating layer, said photoresist layer having a pattern thereon defining contact areas for all said devices;

(e) placing the mask on said wafer so that said indications are aligned with and over the defective devices and their associated contact areas in said pattern;

(f) covering said photoresist layer only in the areas indicated by the mask as corresponding to underlying defective devices thereby also covering the contact areas in said pattern associated with said defective devices so that further processing of the contact areas associated with defective devices is avoided;

(g) removing said mask from said wafer;

(h) providing contact openings by removing the passivating layer only in the contact areas not covered in step (f) above, and which are associated with devices that are within predetermined specifications; and (i) interconnecting the devices which have associated contact openings in said passivating layer whereby only the devices within predetermined specifications are interconnected.

2. A method for testing, selecting and interconnecting isolated semiconductor devices on a single multidevice wafer comprising the steps of:

(a) testing said isolated devices in a predetermined sequence to determine which devices are defective and which are within predetermined specifications;

(b) forming a mask substantially simultaneously with the testing step, said mask having indications thereon corresponding to the positions of defective devices on said wafer, each of said indications having an area slightly larger than one of said devices;

(c) coating the device bearing surface of the wafer with a passivating layer;

(d) providing a photoresist layer having a pattern thereon defining contact areas for all said devices adjacent to said passivating layer;

(e) aligning a mask over said wafer so that said indications on said mask are coincident with said defective devices and their associated contact areas in said pattern;

(f) covering said photoresist layer only in the areas indicated by the mask as corresponding to underlying defective devices thereby also covering the contact areas in said pattern associated with said defective devices so that further processing of the contact areas associated with defective devices is avoided;

(g) removing said mask from said wafer;

(h) providing contact openings by removing said passivating layer only in those contact areas not covered in step (f) above, and which are associated with devices that are within predetermined specifications; and (i) interconnecting the devices having associated contact openings.

3. The method of claim 1 in which the passivating layer is an oxide.

4. The method of claim 1 in which the passivating layer is removed by chemical etching.

5. The method of claim 1 in which the mask is a solid surface with said indications being apertures.

6. The method of claim 5 in which said mask is Mylar.

7. The method of claim 5 in which after aligning the mask with said defective cells an etch resistant substance is applied in said apertures thereby covering said photoresist layer in the areas of the underlying defective devices and their associated contact areas and the passivating layer is removed to form contact openings by chemical etching from the contact areas of all the devices except those covered by said etch resistant substance.

8. The method of claim 7 in which the interconnection is accomplished by metalization between devices having contact openings in the passivating layer.

9. The method of claim 1 in which the mask is a photoresist mask having light areas thereon for contact patterns and the indication of defective devices is accomplished by covering the light areas which correspond to defective devices with a darkening agent.

10. The method of claim 9 in which the area of the passivating layer coincident with the light areas of said photoresist mask are chemically etched to provide contact openings for interconnecting metalization between devices within specification while the areas of the passivating layer coincident with the covered areas of the mask remain unetched thereby providing no contact openings for interconnecting metalization.

11. The method of claim 2 wherein said passivating layer is an oxide and said oxide is removed by chemical etching.

12. The method of claim 11 in which the mask is a solid surface with said indications being apertures.

13. The method of claim 12 in which said mask is Mylar.

14. The method of claim 12 in which after aligning the mask with said defective cells, an etch resistant substance is applied in said apertures thereby covering said photoresist layer in the areas of the underlying defective devices and their associated contact areas and the passivating layer is removed to form contact openings by chemical etching from the contact areas of all the devices except those covered by said etch resistant substance.

15. The method of claim 14 in which the interconnection is accomplished by metalization between devices having contact openings in the passivating layer.

16. The method of claim 2 in which the mask is a photoresist mask having light areas thereon for contact patterns and the indication of defective devices is accomplished by covering the light areas which correspond to defective devices with a darkening agent.

17. The method of claim 16 in which the areas of the passivating layer coincident with the light areas of said photoresist mask are chemically etched to provide contact openings for interconnecting metalization between devices within specification while the areas of the passivating layer coincident with the covered areas of the mask remain unetched thereby providing no contact openings for interconnecting metalization.

References Cited

UNITED STATES PATENTS

| | | |
|---|---|---|
| 3,312,871 | 4/1967 | Seki et al. |
| 3,377,513 | 4/1968 | Ashby et al. |
| 3,423,822 | 1/1969 | Davidson et al. |

CHARLIE T. MOON, Primary Examiner

W. TUPMAN, Assistant Examiner

U.S. Cl. X.R.

29—577, 578; 117—212